(12) United States Patent
Rohleder et al.

(10) Patent No.: US 6,774,688 B2
(45) Date of Patent: Aug. 10, 2004

(54) CIRCUIT FOR SYNCHRONIZING SIGNALS DURING THE EXCHANGE OF INFORMATION BETWEEN CIRCUITS

(75) Inventors: Markus Rohleder, München (DE); Reidar Stief, München (DE)

(73) Assignee: Infineon Technologies AG, Munich (DE)

(*) Notice: Subject to any disclaimer, the term of this patent is extended or adjusted under 35 U.S.C. 154(b) by 109 days.

(21) Appl. No.: 10/134,152

(22) Filed: Apr. 29, 2002

(65) Prior Publication Data

US 2002/0158677 A1 Oct. 31, 2002

(30) Foreign Application Priority Data

Apr. 27, 2001  (DE) .......................................... 101 20 764

(51) Int. Cl.[7] .............................................. H03L 7/06
(52) U.S. Cl. ...................................... 327/158; 327/160
(58) Field of Search ........................ 327/158, 160–163, 327/265, 276, 279, 286

(56) References Cited

U.S. PATENT DOCUMENTS 6,031,429 A    2/2000   Shen 6,437,618 B2 * 8/2002 Lee ............................. 327/158

FOREIGN PATENT DOCUMENTS

| DE | 198 30 571 A1 | 1/2000 |
| DE | 199 10 885 A1 | 10/2000 |
| EP | 0 762 262 A1 | 3/1997 |

* cited by examiner

*Primary Examiner*—Kenneth B. Wells
(74) *Attorney, Agent, or Firm*—Laurence A. Greenberg; Werner H. Stemer; Ralph E. Locher

(57) ABSTRACT

A circuit for synchronizing signals during an exchange of information between circuits, in particular between computer chips, of a system of circuits, is described. The configuration has a delay locked loop (DLL) circuit for synchronizing an internal clock between a respective circuit and an external clock of the circuit system according to the phase difference between the two clocks in a manner dependent on phase changes in the signals. A response sensitivity of the DLL circuit is defined by a filter, which enables a renewed synchronization only after the arrival of a plurality of phase change events. The filter provided for setting the response sensitivity of the DLL circuit is of a variable configuration.

6 Claims, 2 Drawing Sheets

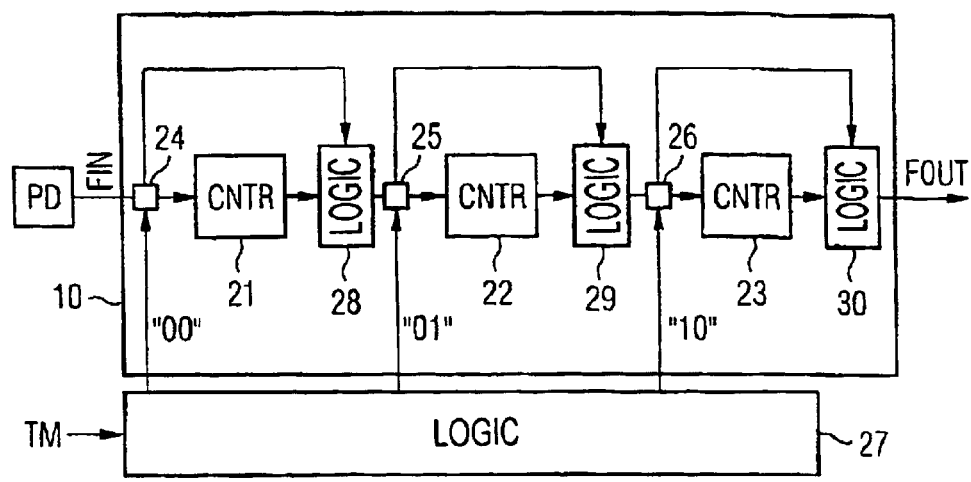
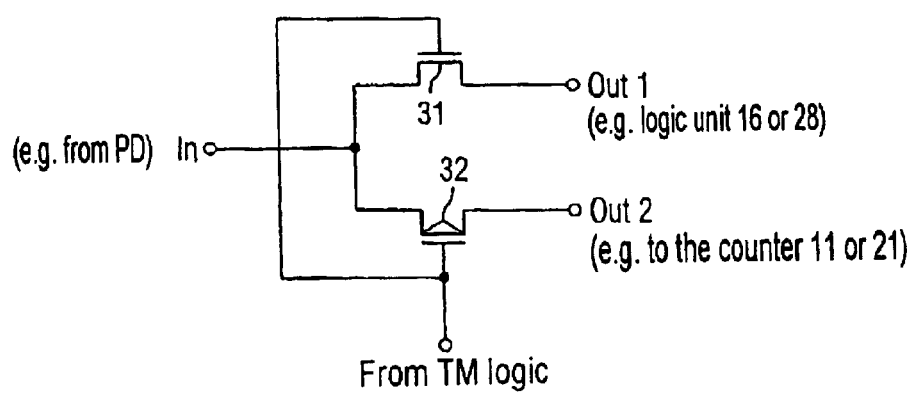

CIRCUIT FOR SYNCHRONIZING SIGNALS DURING THE EXCHANGE OF INFORMATION BETWEEN CIRCUITS

BACKGROUND OF THE INVENTION

Field of the Invention

The invention relates to a circuit for synchronizing signals during the exchange of information between circuits, in particular between computer chips, of a system of circuits, having a delay locked loop (DLL) circuit for synchronizing the internal clock between a respective circuit and the external clock of the circuit system according to the phase difference between these two clocks in a manner dependent on phase changes in the signals. The response sensitivity of the DLL circuit being defined by a filter, which enables a renewed synchronization only after the arrival of a plurality of phase change events.

Computer chips are operated with ever faster clock frequencies. Information is exchanged between the computer chips with signals that have to comply with defined timing specifications. The timing margins available in this case decrease at increasingly faster clock frequencies. Therefore, with increasingly faster clock frequencies, the signals which are transmitted in the context of the exchange of information between the computer chips have to be synchronized ever more accurately with respect to one another.

The task of the synchronization discussed is performed by a delay locked loop circuit (referred to below as a DLL circuit for short) implemented on the respective computer chip. The DLL circuit synchronizes the internal clock within the computer chip with the clock of the circuit system or the system of computer chips. For this purpose, the DLL circuit contains a phase detector which determines the phase difference between the internal clock of the computer chip and the external clock of the overall system. Furthermore, the DLL circuit contains variable delay elements (also referred to below as VCDL) that are connected or disconnected as required.

In order that the DLL circuit does not connect or disconnect delay elements in the case of every phase change, which, in principle, can occur in every clock cycle, a filter is provided in the DLL circuit. The function of the filter is to drive an output signal only after repeated arrival of an input signal and thus to trigger the synchronization by the DLL circuit only after a specific number of clock cycles. The filter is generally implemented on the basis of a plurality of counters and it determines, as discussed above, the sensitivity of the DLL circuit to phase changes. The number of counters in the filter depends on the specific computer chip and the overall system of computer chips and has hitherto formed an invariable quantity.

SUMMARY OF THE INVENTION

It is accordingly an object of the invention to provide a circuit for synchronizing signals during the exchange of information between circuits which overcomes the above-mentioned disadvantages of the prior art devices of this general type, whose sensitivity to phase changes is adjustable.

With the foregoing and other objects in view there is provided, in accordance with the invention, a configuration for synchronizing signals during an exchange of information between circuits of a circuit system. The configuration contains a delay locked loop circuit for synchronizing an internal clock of one of the circuits and an external clock of the circuit system according to a phase difference between the internal clock and the external clock in a manner dependent on phase changes in the signals. The delay locked loop circuit has a filter for defining a response sensitivity of the delay locked loop circuit. The filter enables a renewed synchronization only after an arrival of a plurality of phase change events. The filter has a variable configuration and includes a plurality of counters for generating a synchronization enable signal, and a logic circuit connected to and activating/deactivating the counters.

Accordingly, in contrast to the prior art, which provides a fixed filter configuration, according to the invention the filter contained in the DLL circuit is of a variable configuration. Depending on the construction of the filter, various measures are taken into consideration for altering the filter characteristics. For the case where the filter contains a plurality of counters for generating a synchronization enable signal, the invention provides a logic circuit for activating/deactivating the counters.

The setting of the sensitivity of the DLL circuit to phase changes of input signals plays a significant part in the preliminary stages of the enabling of computer chips or generally of circuits which require a synchronization in order to set the synchronization to the required response sensitivity in a targeted manner before the control operation with a defined response sensitivity. As soon as this setting has been effected, the logic circuit for setting the response sensitivity of the DLL circuit can be deactivated, if appropriate by fuses.

In addition to the principal advantage according to which the synchronization between the computer chips of the system of computer chips can be optimally set according to the invention in the preliminary stages of the control operation, a further advantage is afforded in a reduction in the lock time of the DLL circuit, i.e. a reduction in the duration until the phasing of the DLL circuit. Furthermore, the invention achieves regulation of the DLL current consumption, which is critically determined by the number of time delay changes per unit time and, on account of the filter components that are only partly activated according to the invention, is lower than in the case of constant operation of all the filter components. Finally, the synchronization circuit configured according to the invention ensures optimization of the control speed of the overall system containing circuits or computer chips.

When the filter is constructed from a plurality of counters, the activation/deactivation thereof for the purpose of changing the filter characteristic can be achieved without a great outlay by a transfer gate connected upstream of the respective counter of the filter. The transfer gate can be configured in various ways. It is preferably configured to switch on/off a specific counter or a group of counters while the remaining counters or the remaining counter remain or remains switched on. The transfer gate can be implemented cost-effectively by an n-/p-FET combination.

In accordance with an added feature of the invention, the logic circuit can be put into a test mode for setting the response sensitivity for optimizing synchronization before a control operation with a defined response sensitivity of the configuration is performed.

In accordance with another feature of the invention, the logic circuit has transfer gates connected to and switching on/off the counters in a targeted manner.

Other features which are considered as characteristic for the invention are set forth in the appended claims.

Although the invention is illustrated and described herein as embodied in a circuit for synchronizing signals during the exchange of information between circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a block diagram of a further embodiment of the variable filter of the DLL circuit shown in FIG. 1; and FIG. 4 is a schematic diagram of a transfer gate for switching on/off, in a targeted manner, counters of the filter shown in FIG. 2 and FIG. 3.

DESCRIPTION OF THE PREFERRED EMBODIMENTS

Figure 1:
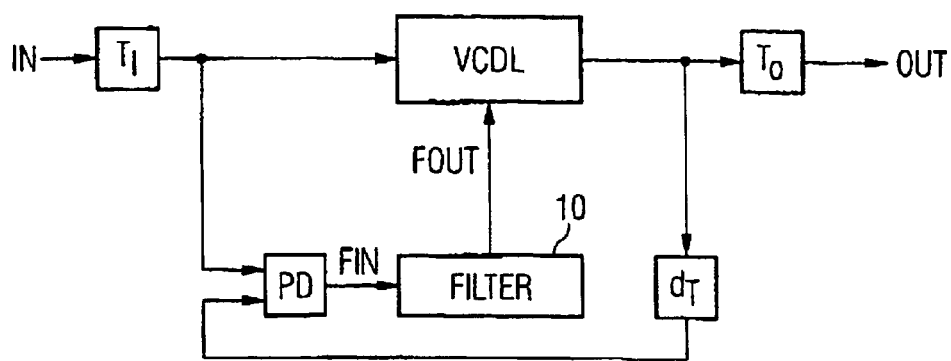
FIG. 1 is a block diagram of a basic construction of a DLL circuit according to the invention.

Referring now to the figures of the drawing in detail and first, particularly, to FIG. 1 thereof, there is shown a general construction of a delay locked loop (DLL) circuit for the synchronization of signals during the exchange of information between circuits. The DLL circuit specifically serves for the synchronization of an internal clock between a respective circuit, for example a computer chip, and an external clock of a system containing a plurality of circuits or computer chips according to the phase difference between the two clocks depending on phase changes of the synchronized signals. For this purpose, in addition to a first invariable delay element $T_I$ at an input of the circuit and an invariable delay element $T_O$ at an output of the circuit, the DLL circuit contains, between these two invariable delay elements $T_I$, $T_O$, variable delay elements designated by VCDL.

The response sensitivity of the DLL circuit is defined by a filter 10, whose output signal acts on the delay elements VCDL and which is acted on by a phase detector PD on the input side. For its part, the phase detector PD is acted on, on the input side, by the output of the invariable delay element $T_I$ and, on the other hand, via a further delay element dT, by the delay elements VCDL.

The function of the filter 10 consists in driving an output signal only after a defined repeated arrival of an input signal and thus in determining the response sensitivity of the DLL circuit.

Figure 2:
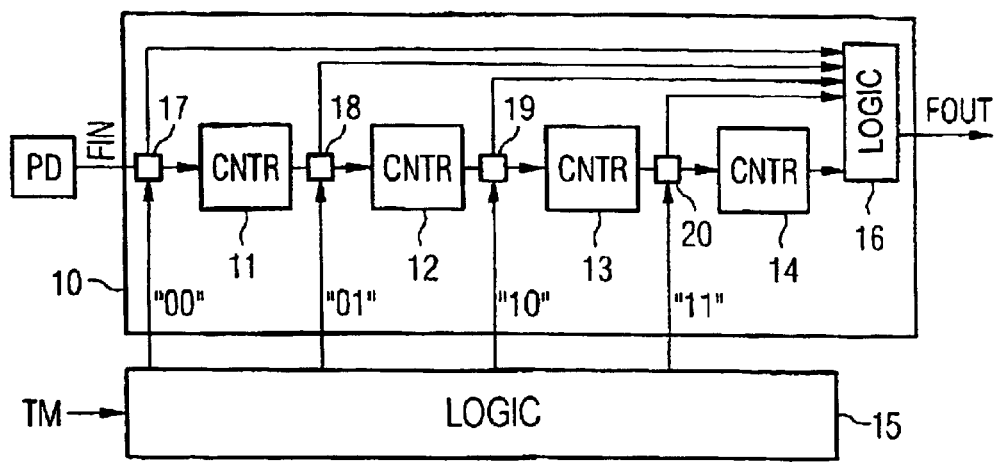
FIG. 2 is a block diagram of an embodiment of a variable filter of the DLL circuit shown in FIG. 1.

The filter 10 is usually realized with a plurality of counters that are connected in series and through which passes the output signal of the phase detector PD. Such an implementation of the filter 10, but with the filter characteristic of the filter 10 being of a variable configuration according to the invention, is shown in FIG. 2. Accordingly, the filter 10 contains four counters 11, 12, 13 and 14. The counters 11 to 14 are connected in series between the input and the output of the filter 10. In this respect, the construction of the filter 10 corresponds to the construction of previous filters in DLL circuits. In a departure therefrom, the invention provides, in a test mode which serves for setting the response sensitivity of the DLL circuit, for one or more of the counters 11 to 14 to be switched on or off in a targeted manner in order to optimize the synchronization, the control operation with a defined response sensitivity of the circuit.

In the embodiment of the filter 10 that is shown in FIG. 2, a logic circuit is provided which performs the targeted switching on/off of the counters 11 to 14. The logic circuit contains a first logic unit 15, which can be controlled by a test mode signal TM and whose four outputs are assigned to the counters 11, 12, 13 and 14. Moreover, the logic circuit contains a second logic unit 16 upstream of the output of the filter 10 and four transfer gates 17, 18, 19 and 20 at the inputs of the counters 11 to 14. A control signal of each of the transfer gates 17 to 20 is acted on by a respective output signal of the first logic unit 15. Furthermore, the four transfer gates 17 to 20 have outputs which are connected either to four inputs of the logic unit 16, or to the downstream counters 11 to 14.

The method of operation of the logic circuit provides for signals proceeding from the first logic unit 15 to activate or not activate the transfer gates 17 to 20 upstream of the counters 11 to 14. If a transfer gate is activated with respect to the counter connected downstream, e.g. only the transfer gates 17 and 18 are activated with respect to the counters connected downstream, whereas the transfer gates 19 and 20 are not activated, so that only the first two counters 11 and 12 in the filter 10 are active. This affects a greater sensitivity than in the case where all four counters 11 to 14 are active or their transfer gates are activated.

The phase detector PD outputs a clock signal depending on the phase difference between the signals that are fed to the delay elements and output by the delay elements. Depending on the switching position of the first transfer gate 17, the clock signal is fed either to the second logic unit 16 or to the first counter 11. The first counter 11 counts up as far as a maximum count depending on the number of clock signals. Upon reaching the maximum count, the first counter 11 outputs a clock signal to the second transfer gate 18. Depending on the switching position of the second transfer gate 18, the clock signal is passed to the second logic unit 16 or the second counter 12. The second counter 12 operates like the first counter 11. After reaching the maximum count, the second counter 12 outputs a clock signal and forwards it to the third transfer gate 19. Depending on the switching position, the third transfer gate 19 passes the clock signal to the second logic unit 16 or to the third counter 13. The third and fourth counters 13, 14 function like the first and second counters. The fourth and fifth transfer gates function like the second and third transfer gates. The second logic unit 16 is configured as an OR gate and forwards a clock signal obtained from the transfer gates or from the fourth counter 14 to the output FOUT. In a simple embodiment, when a clock signal is obtained from the delay element VCDL, a further delay element is connected into the signal path between input IN and output OUT. However, it is also possible to provide a time window in which the clock signals output by the second logic unit 16 are counted and, depending on the number, the number of delay elements to be connected into the signal path is defined.

An alternative embodiment of the filter 10 of FIG. 2 is shown in FIG. 3. A filter 10' contains three series-connected counters 21, 22 and 23, upstream of which there is again connected in each case a transfer gate 24, 25 and 26, respectively. In this embodiment, the logic circuit contains a logic unit 27, controlled by the test mode signal TM, for driving the transfer gates 24, 25 and 26 and also logic units 28, 29 and 30, which are connected downstream of the respective counters 21, 22, 23 and are each acted on by an output signal of the associated transfer gate 24, 25 and 26, respectively.

The method of operation of the filter 10' provides that the logic unit 27 can switch the counters on or off by the transfer gates. By way of example the counter 22 by the transfer gate 25.

The transfer gates 24 to 26 switch a supplied clock signal, depending on the switching position, either to the assigned counter 21, 22, 23 or to the assigned logic 28, 29, 30. The logic modules 28, 29, 30 are embodied as OR gates and forward the supplied clock signal to the respective connected transfer gates 25, 26 or to the output FOUT.

The embodiments of the filters 10, 10' that are shown in FIGS. 2 and 3 are not restricted to the abovementioned numbers of four and three counters, respectively. Moreover, FIGS. 2 and 3 only show exemplary embodiments of the logic driving of the counters of the filter.

FIG. 4 diagrammatically shows an example of an embodiment of a transfer gate that is used in the filters 10, 10' configured according to the invention. Accordingly, the transfer gate contains an n-/p-FET combination with an n-FET 31 and a p-FET 32.

We claim:

1. A configuration for synchronizing signals during an exchange of information between circuits of a circuit system, the configuration comprising:

a delay locked loop circuit for synchronizing an internal clock of one of the circuits and an external clock of the circuit system according to a phase difference between the internal clock and the external clock in a manner dependent on phase changes in the signals, said delay locked loop circuit having a filter for defining a response sensitivity of the delay locked loop circuit, said filter enabling a renewed synchronization only after an arrival of a plurality of phase change events, said filter having a variable configuration and includes:

a plurality of counters for generating a synchronization enable signal; and a logic circuit connected to and activating/deactivating said counters.

2. The configuration according to claim 1, wherein said logic circuit can be put into a test mode for setting the response sensitivity for optimizing synchronization before a control operation with a defined response sensitivity of the configuration is performed.

3. The configuration according to claim 1, wherein said logic circuit has transfer gates connected to and switching on/off said counters in a targeted manner.

4. The configuration according to claim 3, wherein said transfer gates switch on/off a specific counter of said counters or a group of said counters, while any remaining ones of said counters remain switched on.

5. The circuit according to claim 3, wherein said transfer gates have an n-/p-FET combination.

6. The configuration according to claim 1, wherein the circuits are computer chips.

* * * * *